United States Patent [19]

Farb

[11] Patent Number: 5,006,477

[45] Date of Patent: Apr. 9, 1991

[54] METHOD OF MAKING A LATCH UP FREE, HIGH VOLTAGE, CMOS BULK PROCESS FOR SUB-HALF MICRON DEVICES

[75] Inventor: Joseph E. Farb, Riverside, Calif.

[73] Assignee: Hughes Aircraft Company, Los Angeles, Calif.

[21] Appl. No.: 275,833

[22] Filed: Nov. 25, 1988

[51] Int. Cl.⁵ .......................................... H01L 21/265
[52] U.S. Cl. ........................................ 437/34; 437/29; 437/44; 437/30; 148/DIG. 53
[58] Field of Search ................. 437/29, 34, 44, 30; 148/DIG. 53

[56] References Cited

U.S. PATENT DOCUMENTS

| | | | |
|---|---|---|---|
| 4,028,717 | 6/1977 | Joy et al. | 148/DIG. 53 |
| 4,744,859 | 5/1988 | Hu et al. | 437/29 |
| 4,786,609 | 11/1988 | Chen et al. | 437/30 |
| 4,801,555 | 1/1989 | Holley et al. | 437/29 |
| 4,874,713 | 10/1989 | Gioia | 437/44 |

OTHER PUBLICATIONS

Ghandhi, S. K., *VLSI Fabrication Principles*, John Wiley & Sons (1983), (Chapter 6).
Takeda et al., "An As-P(n+-n−) Double MOSFET for VLSI's"; IEEE Transactions on Electron Devices; vol. ED-30, No. 6, Jun. 1983; pp. 652-657.
Mikoshiba et al.; "Comparison of Drain Structures in n-Channel MOSFET's"; IEEE Transactions of Electron Devices; vol. ED-33, No. 1, Jan. 1986; pp. 140-144.
Noguchi et al.,; "Parasitic Resistance Characterization for Optimum Design of Half Micron MOSFET's"; International Electron Devices Meeting 1986; Los Angeles, CA, Dec. 7-10, 1986; Technical Digest, paper 31.4; pp. 730-733.
Lu et al.; "A Folded Extended Window MOSFET for ULSI Applications"; IEEE Electron Device Letters; vol. 9, No. 8, Aug. 1988; pp. 388-390.

*Primary Examiner*—Brian E. Hearn
*Assistant Examiner*—Gordon V. Hugo
*Attorney, Agent, or Firm*—Terje Gudmestad; Jeannette M. Walder; W. K. Denson-Low

[57] ABSTRACT

A process for forming MOS devices having graded source and drain regions. The source and drain regions are lightly doped by ion implantation and then subjected to thermal cycling to diffuse the implanted impurities. The source and drain regions are then heavily doped to form source and drain regions having a heavily doped subregion and a lightly doped subregion. Devices made pursuant to the process, which can be made less than one-half micron, are not subject to gate oxide charging and have high snapback voltages.

14 Claims, 9 Drawing Sheets

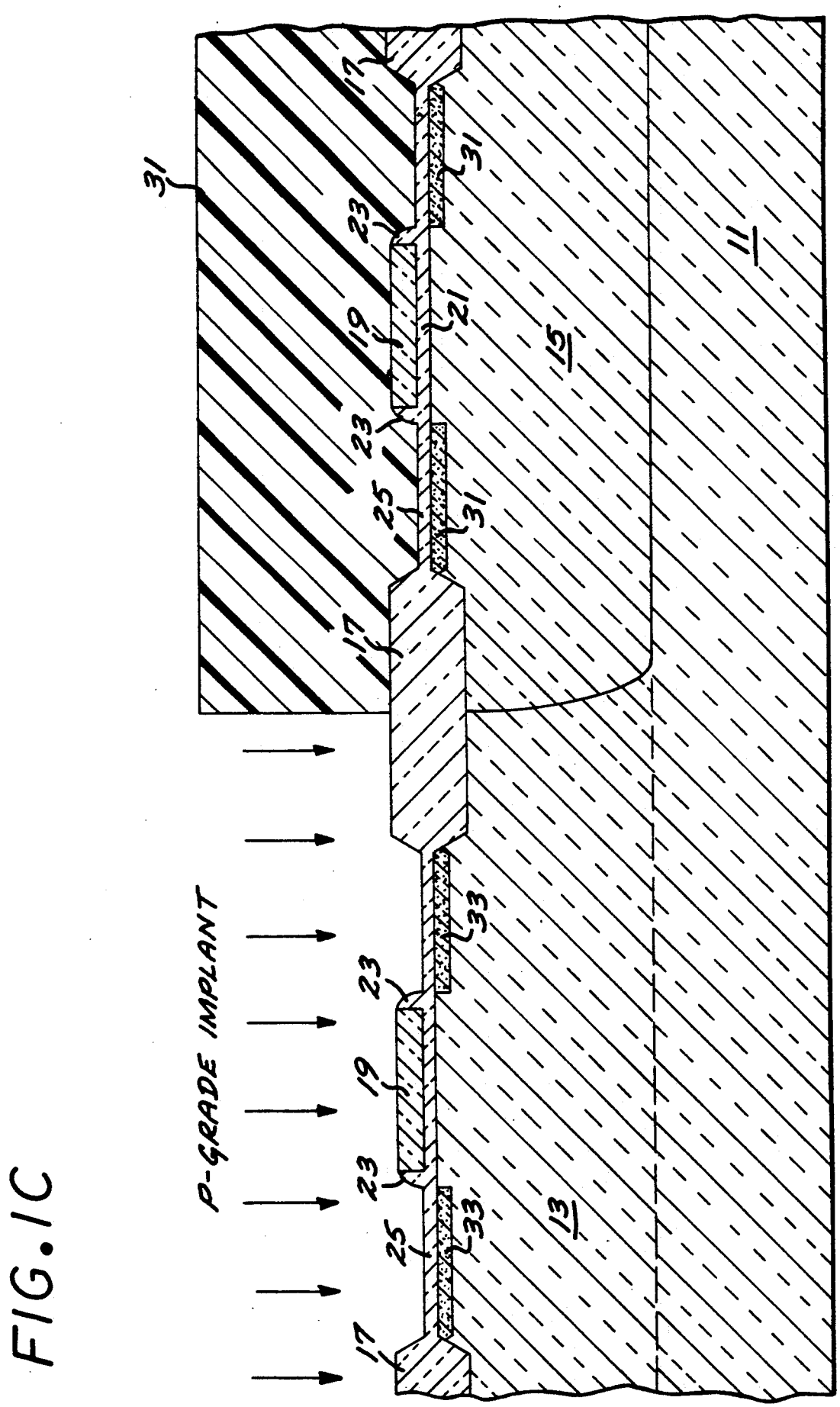

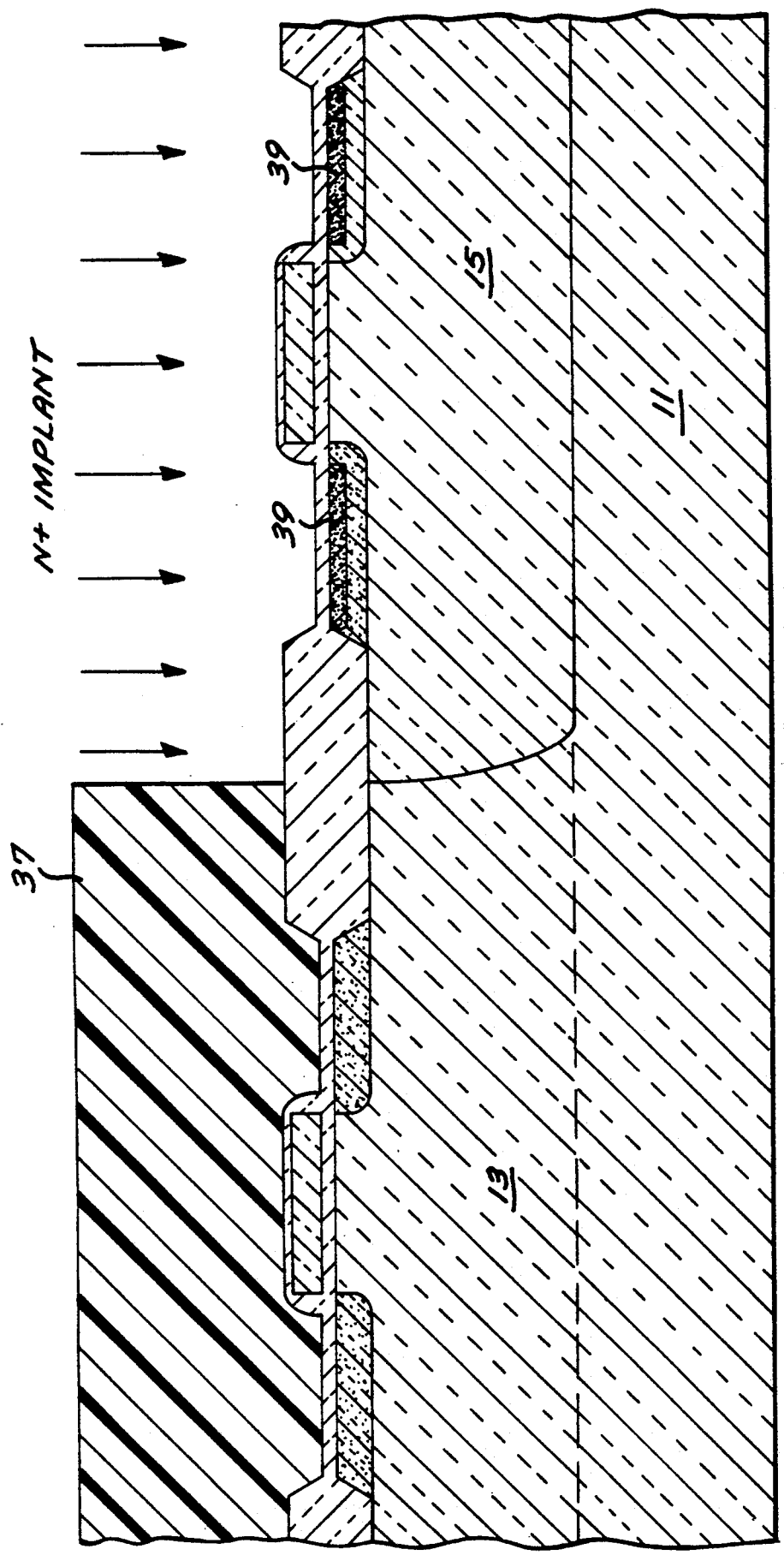

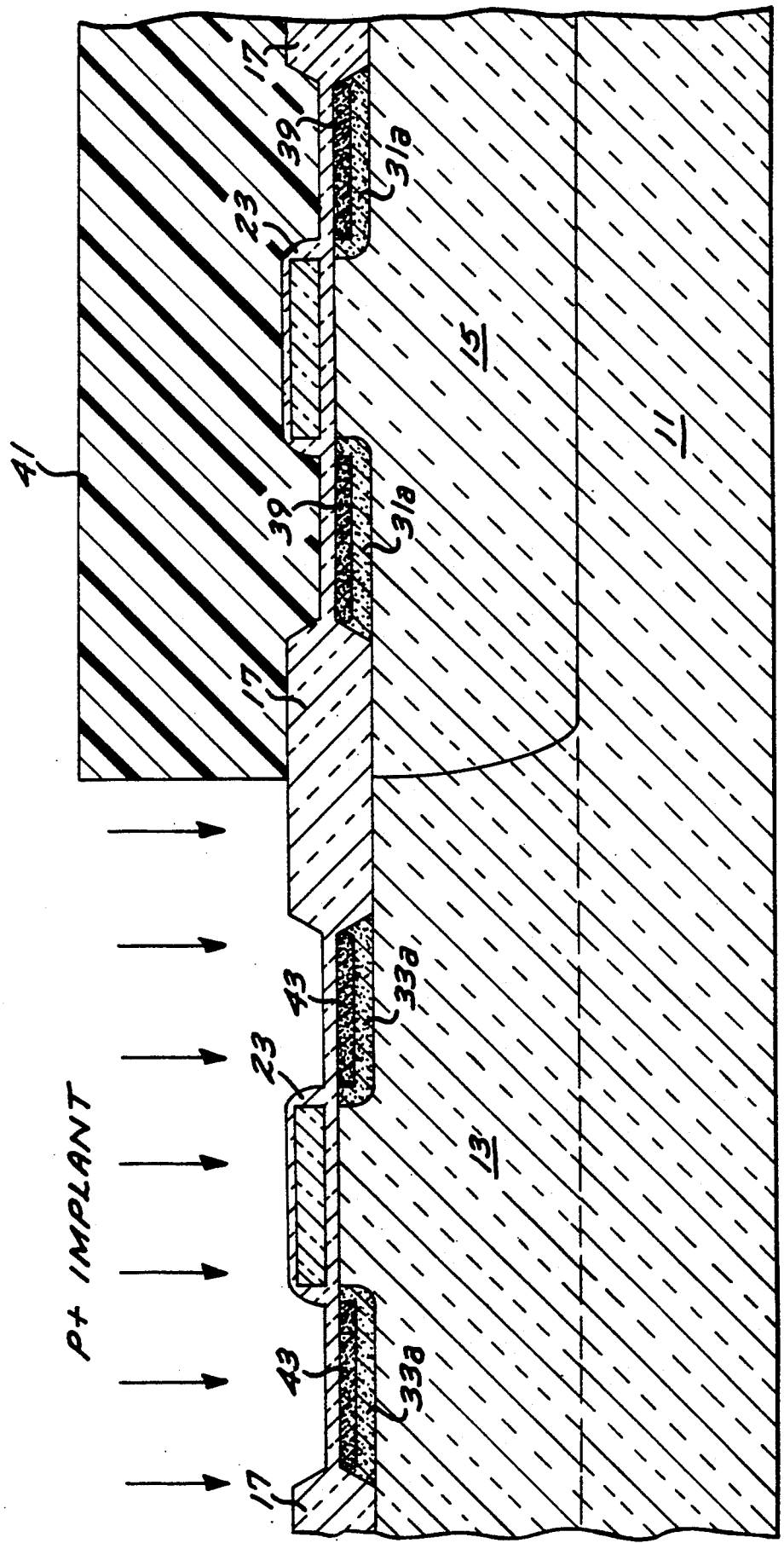

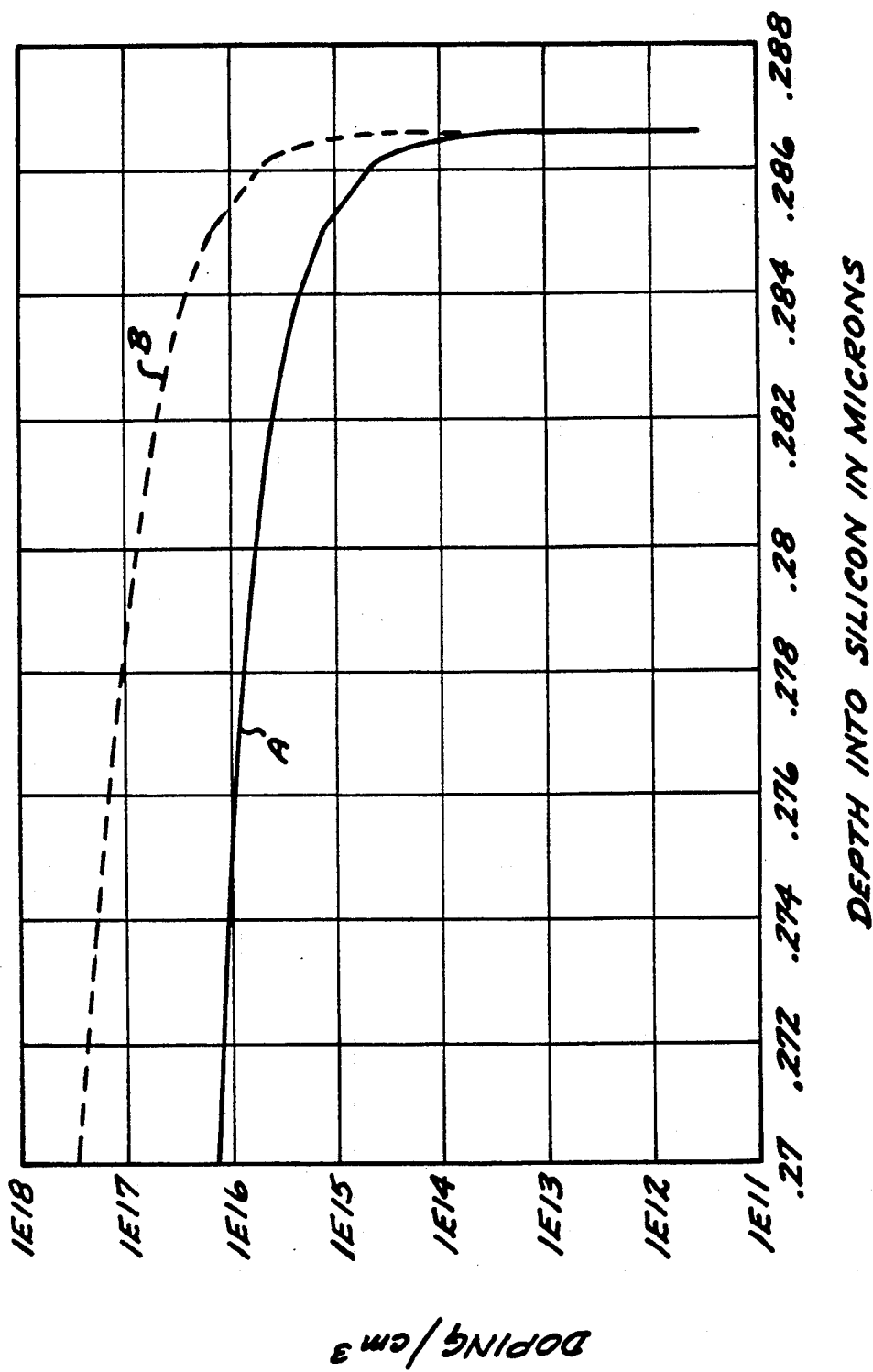

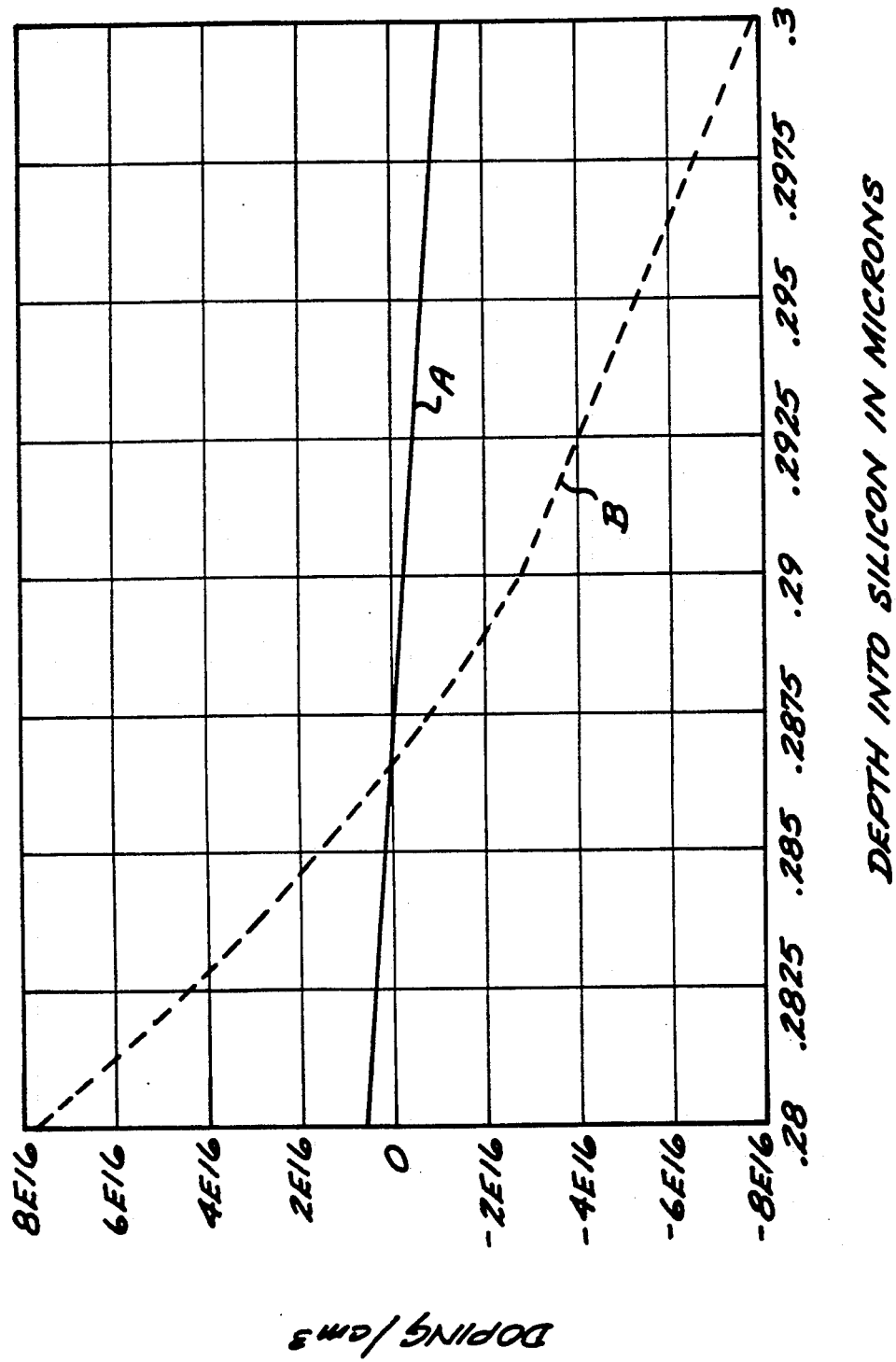

METHOD OF MAKING A LATCH UP FREE, HIGH VOLTAGE, CMOS BULK PROCESS FOR SUB-HALF MICRON DEVICES

BACKGROUND OF THE INVENTION

The disclosed invention generally relates to CMOS integrated circuit processing techniques for forming source and drain regions, and is more particularly directed to a CMOS process for forming source and drain regions for sub-half-micron devices which can operate at voltages higher than 5 volts.

Advances in CMOS integrated circuit processing have made sub-half-micron active devices possible. As devices are made smaller, the doping of the substrate in which the devices are formed is increased to prevent punch-through. The increased substrate doping produces a steep doping concentration gradient across the source/substrate and drain/substrate metallurgical junctions, which increases the field across the junctions. In N-channel devices, the increased electric field increases impact ionization which generates electron-hole pairs. The generated holes present a problem of "snapback" (parasitic n-p-n bipolar transistor action), while the generated electrons present a problem of gate oxide charging.

Snapback occurs when the lateral parasitic n-p-n bipolar transistor (source-substrate-drain) is turned on by the large impact ionization current from the drain before the substrate-drain diode breaks down. The minimum drain voltage at which snapback occurs, called the snapback voltage, decreases as the drain/substrate electric field increases. The snapback problem is worse where the starting substrate material is N type, since a high P-well sheet resistance results in a high effective base resistivity of the lateral parasitic bipolar transistor.

As the field along the channel becomes high, some electrons generated by impact ionization can acquire sufficient energy (hot electrons) to be injected into the gate oxide. Gate oxide charging, which continues to increase with time during device operation, is detrimental to the long term operation of a device.

An analysis of snapback and other short channel effects are discussed in *Physics of Semiconductor Devices*, Second Edition, Sze, pages 480–486 (1981).

A further consideration with smaller devices is the increased susceptibility to latch-up conditions.

Another consideration with CMOS processing of sub-half-micron devices is increased threshold voltage resulting from oxidizing the polysilicon gates after they have been patterned. The oxidation encroaches beneath the polysilicon gates adjacent the source and drain regions which, by virtue of the small size of the device, are controlled to underlap the polysilicon gates by a very small amount. If the encroaching oxide extends over sharply defined source and drain junctions, the increased oxide thickness will produce regions in the channels with substantially higher threshold voltages, and also causes problems in controlling threshold voltage variation.

SUMMARY OF THE INVENTION

It would therefore be an advantage to provide a CMOS process for making sub-half-micron devices that can operate at voltages greater than 5 volts without snapback.

It would also be an advantage to provide a CMOS process for making sub-half-micron devices that are not subject to gate oxide charging.

Another advantage would be to provide a CMOS process for making sub-half-micron devices that have reduced susceptibility to latch-up.

A further advantage would be to provide a CMOS process for making sub-half-micron devices wherein the threshold voltage is not increased as result of oxidizing the polysilicon gates.

The forgoing and other advantages and features are provided by the invention in a process for forming source and drain regions having lightly doped subregions in a twin-well integrated circuit wafer having polysilicon gates formed thereon. The source and drain regions are lightly doped, and the wafer is subjected to thermal driving which diffuses the implanted dopants. The source and drain regions are then heavily doped, thereby forming source and drain regions respectively having a heavily doped subregion and a lightly doped subregion.

BRIEF DESCRIPTION OF THE DRAWING

The advantages and features of the disclosed invention will readily be appreciated by persons skilled in the art from the following detailed description when read in conjunction with the drawing wherein:

FIGS. 1B and 1C are partial sectional views helpful in illustrating the step of lightly implanting the source and drain regions.

FIGS. 1E and 1F are partial sectional views helpful in illustrating the step of heavily implanting the source and drain regions after they have been lightly doped.

FIGS. 2A–2C are plots of net doping concentrations for a device in accordance with the invention and for a device made with known techniques.

DETAILED DESCRIPTION

Figure 1A:
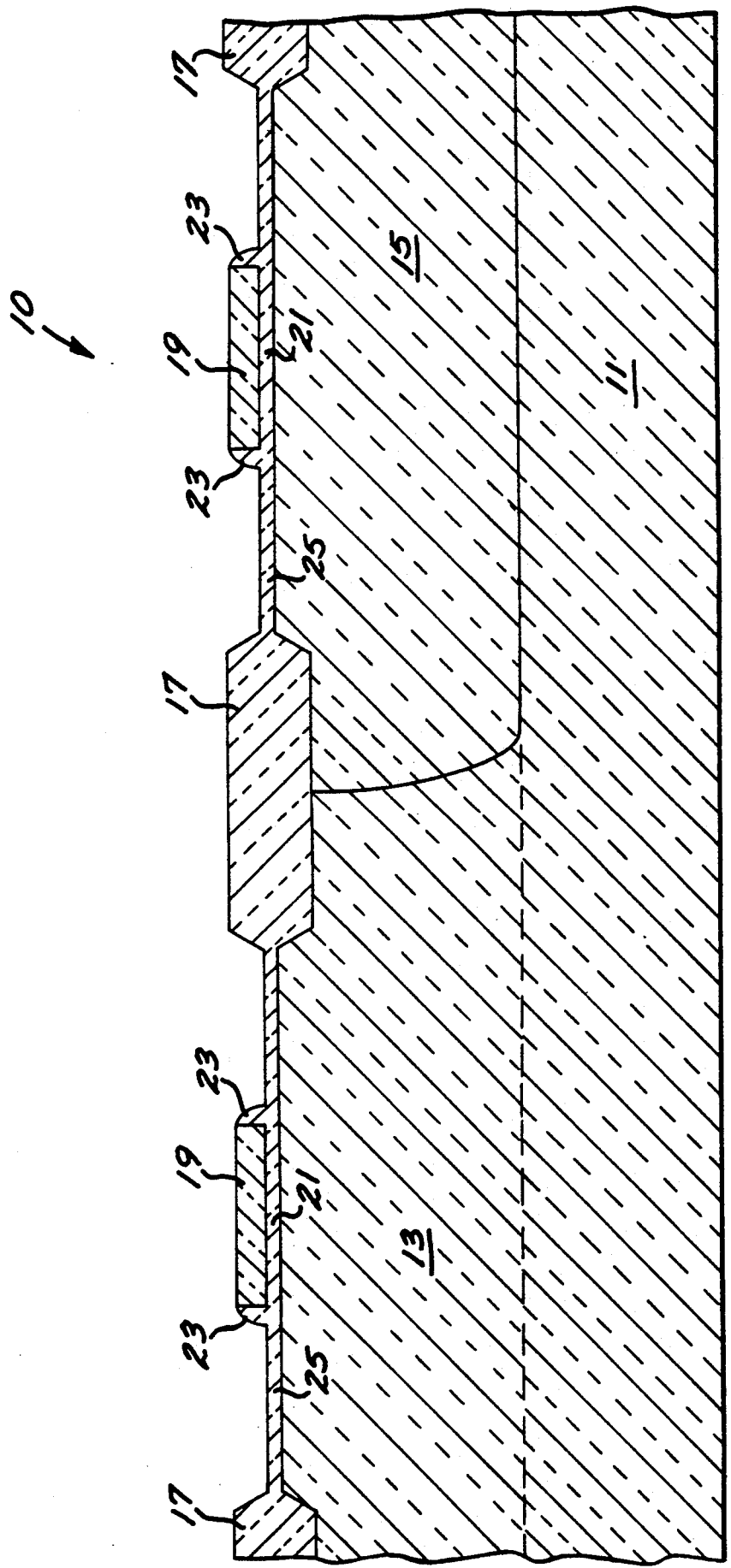
FIG. 1A is a partial sectional view of a twin-well CMOS integrated circuit wafer having polysilicon gates formed thereon with oxide spacers surrounding the gates.

In the following detailed description and in the several FIGURES of the drawing, like elements are identified with like reference numerals.

The following discussion will include references to doping of regions in a silicon substrate. As used herein, "light implant" means a dose equal to or greater than $1 \times 10^{12}$ ions/cm$^2$ and less than $1 \times 10^{15}$ ions/cm$^2$ which produces a "lightly doped" region having doping concentrations equal to or greater than $1 \times 10^{16}$ atoms/cm$^3$ and less than $1 \times 10^{19}$ atoms/cm$^3$. "Heavy implant" means a dose equal to or greater than $1 \times 10^{15}$ ions/cm$^2$ and less than $1 \times 10^{17}$ ions/cm$^2$ which produces a "heavily doped" region having doping concentrations equal to or greater than $1 \times 10^{19}$ atoms/cm$^3$ and less than $1 \times 10^{21}$ atoms/cm$^3$. For the implantation of boron, the foregoing can be achieved with implantation energy in the range of $50 \pm 25$ KeV. For the implantation of arsenic or phosphorus, the foregoing can be achieved with implantation energy in the range of $100 \pm 50$ KeV.

Referring now to FIG. 1, schematically illustrated therein is a partial sectional view of an integrated circuit wafer 10 being processed which includes a silicon N⁻ substrate 11 having N-wells 13 and P-wells 15 formed therein pursuant to known processing techniques. The wafer 10 further includes field oxide regions 17 separating and surrounding the active areas which include polysilicon gates 19 that are separated from the N-wells and P-wells by gate oxide 21. The polysilicon gates 19 typically comprise portions of polysilicon lines that are respectively surrounded by oxide spacers 23. Active area oxide layers 25 cover the regions of the wells where source and drain regions will be formed.

Figure 1B:
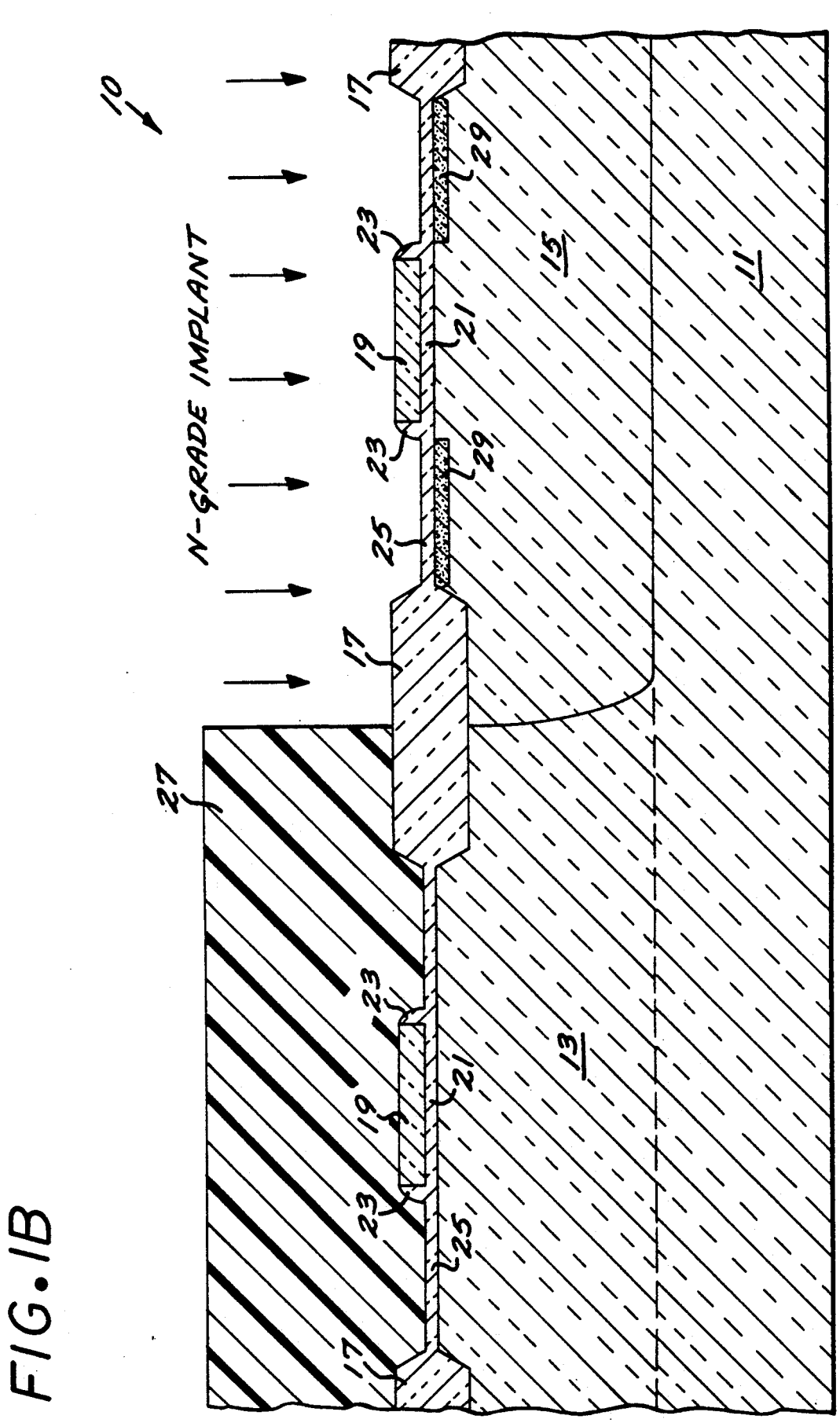

Referring now to FIG. 1B, an N-implant source/drain photoresist mask 27 is formed on the wafer (e.g., by known photolithographic techniques) to cover the N-well regions 13. Lightly doped N− implant regions 29 are formed in the source and drain regions of the P-wells 15 by ion implantation of an appropriate impurity, for example, phosphorus at a dose of $1 \times 10^{13}$ atoms/cm$^2$ at 80 KeV.

Referring now to FIG. 1C, the N-implant source drain mask 27 is stripped, and a P-implant source drain photoresist mask 31 is formed on the wafer (e.g., by known photolithographic techniques) to cover the P-well regions 15. Lightly doped P− implant regions 33 are formed in the source and drain regions of the N-well regions 13 by ion implantation of an appropriate impurity, for example, boron at a dose of $1 \times 10^{13}$ atoms/cm$^2$ at 35 KeV.

Figure 1D:
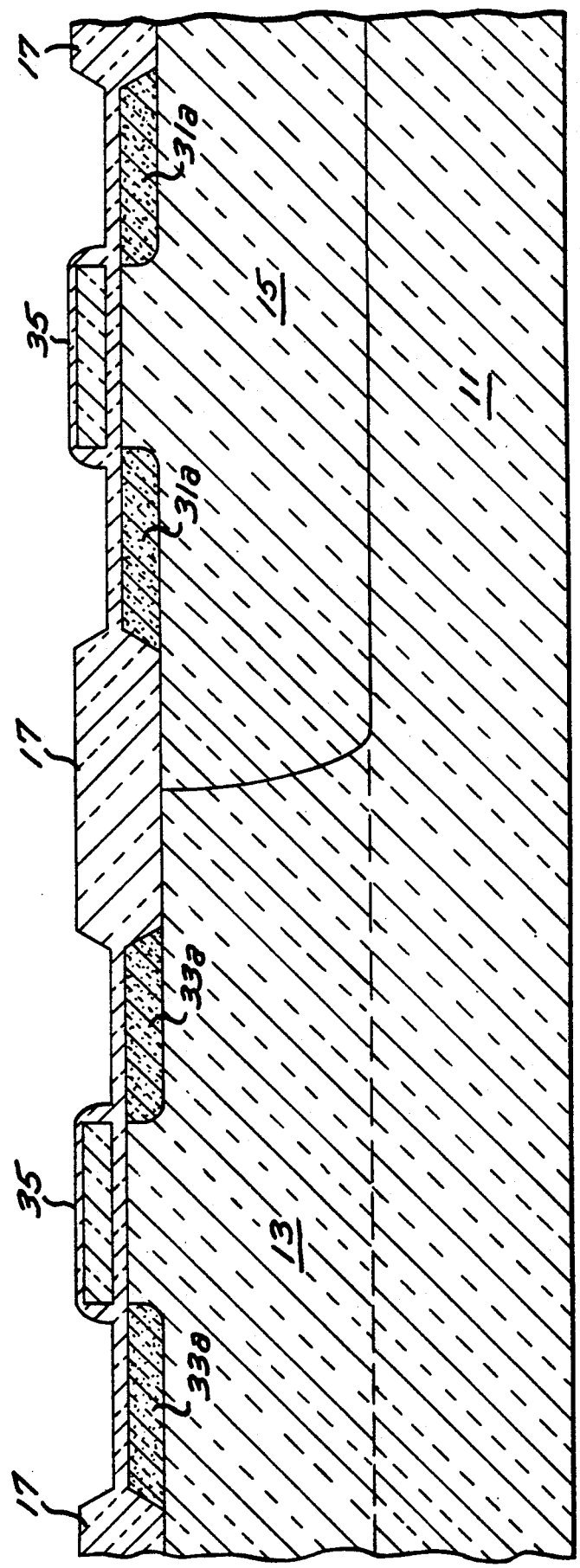
FIG. 1D is a partial sectional view helpful in illustrating the step of thermal driving to diffuse the impurities implanted by the light doping illustrated in FIGS. 1B and 1C.

Referring now to FIG. 1D, the wafer 10 having the lightly doped implanted regions 31, 33 is thermally cycled in a furnace to form lightly doped N− and P− graded regions 31A, 33A. By way of example, after appropriate temperature ramp-up and stabilization, the wafer 10 is subjected to a temperature of 1050° C. for 15 minutes in the presence of oxygen and for an additional 25 minutes in the presence of argon. The time T of the thermal cycling will depend on temperature, and the relationship between the time T and temperature is defined by the proper range of the product D*T, where D is the appropriate diffusion coefficient for the substrate and the diffusing atoms and has the dimension of length$^2$ per unit time. For length expressed in microns, the product D*T should be in the range of 0.01 to 0.2 microns$^2$.

As a result of the thermal cycling, the implanted impurities diffuse downwardly and laterally to form the lightly doped N− and P− graded regions 31A, 33A wherein the net carrier concentration (i.e., the difference between the opposite type carriers) varies generally linearly with distance from the top surface and across the metallurgical junction between the graded regions and the associated wells.

As a result of the lateral diffusion due to the thermal cycling, the N− and P− graded regions 31A, 33A extend beneath the spacers 23. Depending upon the desired device characteristics, the edge of the graded regions is controlled to be near the edges of the polysilicon gates 17 or slightly underlapping the gates. For example, for faster devices, an underlap of 250 Angstroms might be appropriate, while for slower devices, the respective edges might be laterally spaced by as much as 250 Angstroms.

As a result of utilizing oxygen during a portion of the thermal cycling, an oxide layer 35 is grown on the polysilicon gates 19. Alternatively, such oxide layer can be grown pursuant to subsequent processing that is performed prior to the heavy implants of the source and drain regions now to be discussed.

Referring now to FIG. 1E, a further N-implant source/drain photoresist mask 37, similar to the prior N-implant mask 27, is formed on the wafer to cover the N-well regions 13. Heavily doped N+ regions 39 are formed in the source and drain regions of the P-wells 15 by ion implantation of an appropriate impurity, for example, arsenic at a dose of $5 \times 10^{15}$ atoms/cm$^2$ at 100 KeV.

Referring now to FIG. 1F, a further P-implant source/drain photoresist mask 41, similar to the prior P-implant mask 29, is formed on the wafer to cover the P-well regions 13. Heavily doped P+ regions 43 are formed in the source and drain regions of the N-wells 13 by ion implantation of an appropriate impurity, for example, boron at a dose of $3 \times 10^{15}$ atoms/cm$^2$ at 28 KeV.

Pursuant to the steps of heavy implantation, each of the source and drain regions respectively includes a heavy implant subregion (39 or 43) and a lightly doped graded subregion (31A or 33A). As shown in FIG. 1F, the heavy implant subregions are immediately beneath the oxide layers 25 and are bounded by the associated oxide spacers 23 and the field oxide regions 17. The lightly doped graded subregions are beneath the heavy implant subregions and extend from beneath the associated oxide spacers to the sloped boundaries of the field oxide regions 17.

After the implantation of the heavy implant subregions of the source and drain regions, the wafer is processed pursuant to known techniques, including for example the vapor depositing oxide, rapid thermal annealing to flow the oxide and to activate the source and drain regions, and metallization, to produce completed integrated circuits. Such further processing preferably does not include extended thermal cycling so that the subregions of the source and drain regions do not become diffused.

Figure 2A:
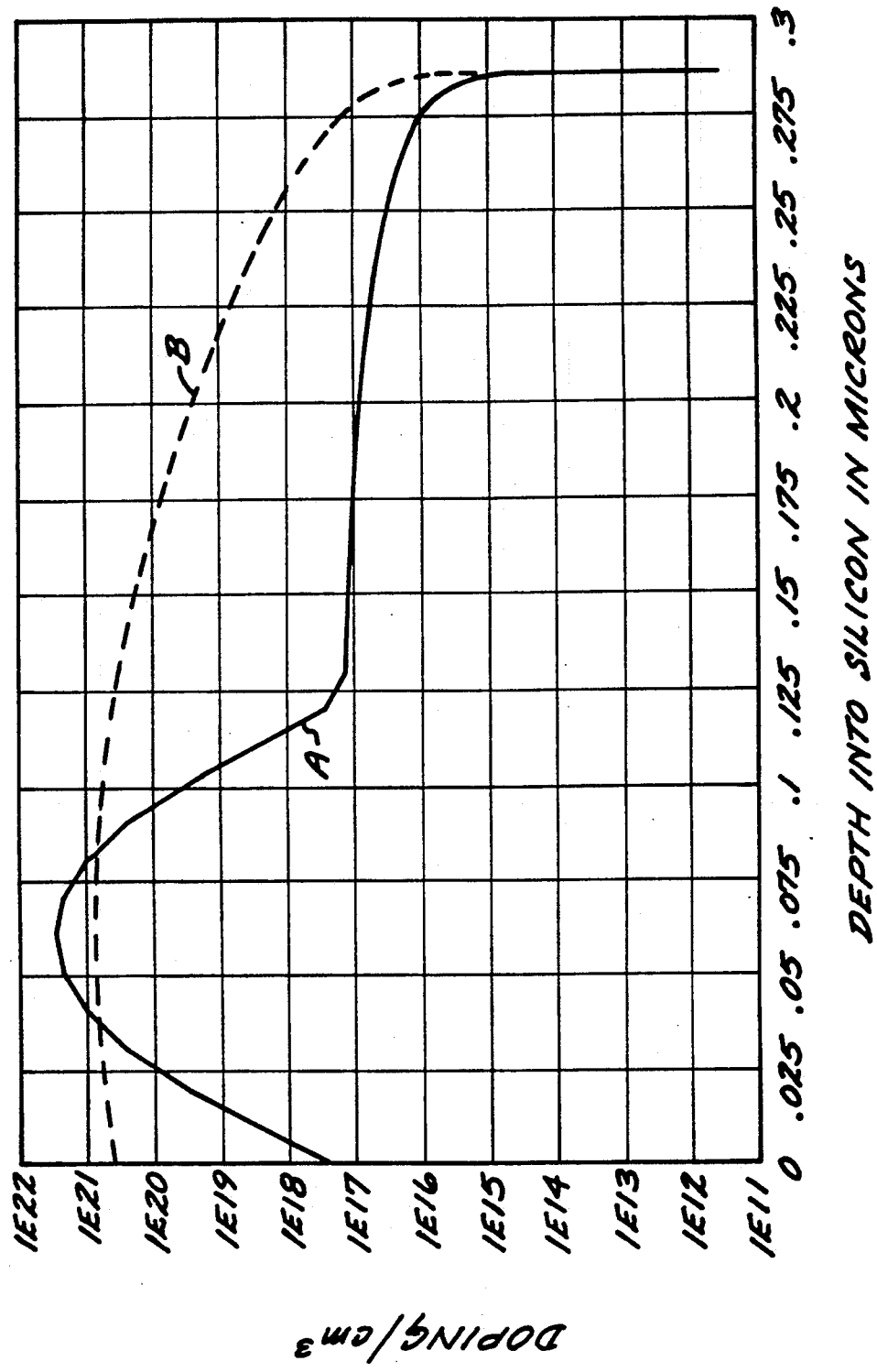

By way of example, FIGS. 2A–2C set forth respective plots of net carrier concentration [(N-type)-(P-type)] as a function of distance from the top surface for (A) a source or drain region comprising the heavily doped subregion 39 and the lightly doped graded region 31A, and (B) a source or drain region of an N-channel device made pursuant to conventional processes. A greater number of N-type carriers is represented by a positive number, while a greater number of P-type carriers is represented by a negative number.

FIG. 2C particularly demonstrates that for an N-channel device in accordance with the invention, the doping concentration gradient across the metallurgical junction (where the net doping concentration is zero) is shallow. The net carrier concentration of a source or drain region of a P-channel device in accordance with the invention would be similarly graded.

As a result of the graded source and drain junctions, the field across the junctions is reduced and impact ionization is reduced. Since fewer holes are generated by impact ionization, the snapback voltages for N-channel devices are relatively high, for example, 8 volts or better for effective channel lengths of 0.4 microns. As to P-channel devices, the graded junctions result in higher diode breakdown voltages.

Since fewer electrons are generated and the drain junction field is kept low, gate oxide charging is prevented or significantly reduced.

The N− graded junctions also reduce the latch-up susceptibility of the CMOS devices because of their inherently smaller impact ionization hole current and reduced efficiency of the emitters of the parasitic transistors.

A further benefit of the graded source and drain regions is the prevention of increased threshold voltages when the polysilicon gates are oxidized after patterning. Sometimes it is advantageous to oxidize polysilicon gates after they are patterned, prior to formation of the oxide spacers. With small devices, however, the oxidation will encroach beneath sides of the polysilicon gate adjacent the source and drain regions, making the gate oxide thicker in the areas of encroachment. If the thicker gate oxide extends into a channel having a sharp source or drain junction transition, the increased oxide thickness requires a higher threshold voltage. Moreover, the increased oxide thickness presents difficulties in controlling threshold voltage variation. With the graded junctions of the invention, the lightly graded subregions of the source and drain regions extend beneath the oxide spacers to prevent the increase in threshold voltage due to increased gate oxide thickness that can occur if the polysilicon gates are oxidized, and further avoid process problems in controlling threshold voltage variation.

Briefly, the disclosed process provides for reliable sub-half-micron devices that can operate at voltages greater than 5 volts, are not subject to gate oxide charging are latch-up resistant, and have consistent threshold voltages that are not increased if the polysilicon gates are oxidized. It should be appreciated that while the disclosed process has been discussed in the context of twin-well CMOS structures, it can be utilized with other CMOS structures such P-well and N-well structures. It can also be utilized with NMOS and PMOS structures.

Although the foregoing has been a description and illustration of specific embodiments of the invention, various modifications and changes thereto can be made by persons skilled in the art without departing from the scope and spirit of the invention as defined by the following claims.

What is claimed is:

1. In an integrated circuit wafer having a substrate with gate regions and field oxide regions formed thereon, a method for doping source and drain regions for sub-half-micron devices in the substrate adjacent the top surface thereof on opposing sides of each gate region, comprising the steps of:
    forming oxide spacers surrounding said gate regions;
    forming lightly doped graded regions in the source and drain regions having a doping concentration that decreases linearly with distance from the top surface of the source and drain regions; and
    forming respective heavily doped regions in each of the lightly doped graded regions adjacent the surface of the source and drain regions.

2. The method of claim 1 wherein the step of forming doped graded regions includes the steps of:
    subjecting the source and drain regions to ion implantation at a dose equal to or greater than $1 \times 10^{12}$ ions/cm$^2$ and less than $1 \times 10^{15}$ ions/cm$^2$ to form lightly doped regions adjacent the top surface of the source and drain regions; and
    heating the source and drain regions to vertically and laterally diffuse the impurities implanted in the lightly doped regions.

3. The method of claim 1 wherein the step of forming the heavily doped regions includes the step of ion implantation at a dose equal to or greater than $1 \times 10^{15}$ ions/cm$^2$ and less than $1 \times 10^{17}$ ions/cm$^2$.

4. A method of fabricating sub-half-micron integrated circuits comprising:
    providing a semiconductor substrate of a first conductivity type;
    forming a layer of oxide on the semiconductor substrate;
    forming a gate of semiconductor material of said first conductivity type on said oxide layer on a predefined region;
    forming an oxide spacer surrounding said gate;
    implanting first ions of a second conductivity type at a dose equal to or greater than about $1 \times 10^{12}$ ions/cm$^2$ and less than about $1 \times 10^{15}$ ions/cm$^2$;
    heating said substrate to a first predetermined temperature for a first predetermined time;
    implanting second ions of a second conductivity type at a dose equal to or greater than about $1 \times 10^{15}$ ions/cm$^2$ and less than about $1 \times 10^{17}$ ions/cm$^2$; and
    heating said substrate to a second predetermined temperature for a second predetermined period of time sufficient to activate the implants.

5. The method defined in claim 4 wherein said step of implanting first ions includes the step of implanting boron with an implantation energy of $50 \pm 25$ KeV.

6. The method defined in claim 4 wherein said step of implanting first ions includes the step of implanting phosphorus or arsenic with an implantation energy of $100 \pm 50$ KeV.

7. The method defined in claim 4 wherein said first conductivity type is P-type and said second conductivity type is N-type.

8. The method defined in claim 4 wherein said first conductivity type is N-type and said second conductivity type is P-type.

9. The method defined in claim 4 wherein said step of heating said substrate is performed in the presence of oxygen and then argon.

10. A method for forming a sub-half-micron semiconductor integrated circuit, comprising the steps of:
    providing a semiconductor substrate having a first surface;
    forming an oxide layer on the first surface of the semiconductor substrate;
    disposing a gate made of semiconductor material on said oxide layer;
    forming an oxide spacer surrounding said gate;
    forming first source and drain regions in said substrate adjacent said first surface and on opposite sides of said gate wherein said first source and drain regions have a doping concentration that decreases linearly with distance from the top surface of said first source and drain regions; and
    forming second heavily doped source and drain region on opposite sides of said gate respectively within said first source and drain regions.

11. The method defined in claim 10 wherein said first source and drain regions are formed by implanting ions at a dose equal to or greater than about $1 \times 10^{12}$ ions/cm$^2$ and less than about $1 \times 10^{15}$ ions/cm$^2$.

12. The method defined in claim 11 wherein said second source and drain regions are formed by implanting ions at a dose of equal to or greater than about $1 \times 10^{15}$ ions/cm$^2$ and less than about $10 \times 10^{17}$ ions/cm$^2$.

13. The method defined in claim 12 further including after the step of first implanting ions, the step of heating said substrate to a first predetermined temperature for a first predetermined period of time T such that the product D*T, where D is the diffusion coefficient in microns$^2$/unit time, is in the range of 0.01 to 0.2 microns$^2$.

14. The method defined in claim 13 further including after the second implanting step, heating said substrate to a second predetermined temperature for a second predetermined period of time sufficient to activate the implants.

* * * * *